United States Patent
Blanchard et al.

(10) Patent No.: US 6,750,104 B2
(45) Date of Patent: Jun. 15, 2004

(54) HIGH VOLTAGE POWER MOSFET HAVING A VOLTAGE SUSTAINING REGION THAT INCLUDES DOPED COLUMNS FORMED BY TRENCH ETCHING USING AN ETCHANT GAS THAT IS ALSO A DOPING SOURCE

(75) Inventors: Richard A. Blanchard, Los Altos, CA (US); Fwu-Iuan Hshieh, Saratoga, CA (US)

(73) Assignee: General Semiconductor, Inc., Melville, NY (US)

( * ) Notice: Subject to any disclaimer, the term of this patent is extended or adjusted under 35 U.S.C. 154(b) by 0 days.

(21) Appl. No.: 10/039,284

(22) Filed: Dec. 31, 2001

(65) Prior Publication Data

US 2003/0122189 A1 Jul. 3, 2003

(51) Int. Cl.[7] ............................................. H01L 21/336
(52) U.S. Cl. ....................... 438/268; 438/212; 438/284
(58) Field of Search ................................ 438/268, 212, 438/284; 257/341

(56) References Cited

U.S. PATENT DOCUMENTS

| | | | | |
|---|---|---|---|---|
| 4,140,558 | A | 2/1979 | Murphy et al. | 148/175 |
| 4,419,150 | A | 12/1983 | Soclof | 148/187 |
| 4,569,701 | A | 2/1986 | Oh | 148/188 |
| 4,711,017 | A | 12/1987 | Lammert | 437/20 |
| 4,893,160 | A | 1/1990 | Blanchard | 357/23.4 |
| 5,108,783 | A | 4/1992 | Tanigawa et al. | 437/63 |
| 5,216,275 | A | 6/1993 | Chen | 257/493 |
| 5,759,921 | A * | 6/1998 | Rostoker | 438/711 |
| 5,912,497 | A | 6/1999 | Baliga | 257/366 |
| 6,479,352 | B2 * | 11/2002 | Blanchard | 438/268 |
| 6,534,836 | B1 * | 3/2003 | Osanai | 257/401 |
| 6,608,350 | B2 * | 8/2003 | Kinzer et al. | 257/341 |
| 2001/0026977 | A1 | 10/2001 | Hattori et al. | 438/268 |
| 2001/0036704 | A1 | 11/2001 | Hueting et al. | 438/270 |
| 2001/0053568 | A1 | 12/2001 | Deboy et al. | 438/138 |

OTHER PUBLICATIONS

U.S. patent application Ser. No. 09/970,972, Blanchard et al., filed Oct. 4, 2001.

(List continued on next page.)

*Primary Examiner*—Phat X. Cao
(74) *Attorney, Agent, or Firm*—Mayer Fortkort & Williams, PC; Stuart H. Mayer, Esq.; Karin L. Williams, Esq.

(57) ABSTRACT

A method is provided for forming a power semiconductor device. The method begins by providing a substrate of a first conductivity type and then forming a voltage sustaining region on the substrate. The voltage sustaining region is formed by depositing an epitaxial layer of a first conductivity type on the substrate and forming at least one trench in the epitaxial layer. At least one doped column having a dopant of a second conductivity type is located in the epitaxial layer, adjacent a sidewall of the trench. The trench is etched using an etchant gas that also serves as a dopant source for the formation of the doped column. For example, if a p-type dopant such as boron is desired, BCl3 may be used as the etchant gas. Alternatively, if an n-type dopant such as phosphorus is required, PH3 may be used as the etchant gas. The dopant present in the gas is incorporated into the silicon defining the surfaces of the trench. This dopant is subsequently diffused to form the doped column surrounding the trench. The trench is filled with an insulating material such as silicon dioxide, silicon nitride, polysilicon, or a combination of such materials. The step of filling the trench may be performed before or after the dopant is diffused to form the doped column. Finally, at least one region of the second conductivity type is formed over the voltage sustaining region to define a junction therebetween.

17 Claims, 5 Drawing Sheets

THE DOPANT DISTRIBUTION OF A HIGH VOLTAGE VERTICAL DMOS TRANSISTOR WITH A RELATIVELY LOW ON-RESISTANCE

OTHER PUBLICATIONS

G. Deboy et al., "A new generation of high voltage MOSFETs breaks the limit line of silicon," *Int'l Electron Devices Meeting.* Dec. 1998, 26.2.1, pp. 683–685.

U.S. patent application Ser. No. 10/039,241, Blanchard, filed Dec. 31, 2001.

U.S. patent application Ser. No. 10/038,845, Blanchard, filed Dec. 31, 2001.

U.S. patent application Ser. No. 09/970,758, Blanchard et al., filed Oct. 4, 2001.

Xing Bi Chen et al., "A Novel High–Voltage Sustaining Structure with Buried Oppositely Doped Regions," *IEEE Transactions on Electron Devices,* vol. 47, No. 6, Jun. 2000, pp. 1280–1285.

N. Cezac et al., "A New Generation of Power Unipolar Devices; the Concept of the Floating Islands MOS Transistor (FLIMOST) " Proceedings of the 12th International Symposium on Power Semiconductor Devices & ICs, Toulouse, France, May 22–25, 2000, pp. 69–72.

U.S. patent application Ser. No. 10/039,068, Blanchard, filed Dec. 31,2001.

Ming–Kwang Lee et al., "On the Semi–Insulating Polycrstalline Sillcon Resistor," *Solid State Electronics,* vol. 27, No. 11, 1984, pp. 995–1001.

* cited by examiner

CONVENTIONAL MOSFET

THE DOPANT DISTRIBUTION OF A HIGH VOLTAGE VERTICAL
DMOS TRANSISTOR WITH A RELATIVELY LOW ON-RESISTANCE

1. GROW/DEPOSIT A TRENCH ETCH-STEP LAYER
2. MASK AND ETCH THE TRENCH ETCH-STEP LAYER
3. ETCH THE TRENCH USING A GAS THAT CONTAINS THE DESIRED DOPANT SPECIES

4. FILL THE TRENCH WITH A DIELECTRIC OR A HIGH RESISTIVITY LAYER
5. PLANARIZE
6. DIFFUSE THE DOPANT TO FORM THE DESIRED JUNCTION

THE DOPANT DISTRIBUTION OF A HIGH VOLTAGE VERTICAL
DMOS TRANSISTOR WITH A RELATIVELY LOW ON-RESISTANCE

US 6,750,104 B2

HIGH VOLTAGE POWER MOSFET HAVING A VOLTAGE SUSTAINING REGION THAT INCLUDES DOPED COLUMNS FORMED BY TRENCH ETCHING USING AN ETCHANT GAS THAT IS ALSO A DOPING SOURCE

RELATED APPLICATIONS

This application is related to copending U.S. patent application Ser. No. 09/970,972 entitled "Method for Fabricating a Power Semiconductor Device Having a Floating Island Voltage Sustaining Layer," filed in the United States Patent and Trademark Office on Oct. 4, 2001.

This application is related to copending U.S. patent application Ser. No. 10/039,068 entitled "Method For Fabricating A High Voltage Power MOSFET Having A Voltage Sustaining Region That Includes Doped Columns Formed By Rapid Diffusion," filed in the United States Patent and Trademark Office on Dec. 31, 2001.

This application is related to copending U.S. patent application Ser. No. 10/038,845 entitled "High Voltage MOSFET Having A Voltage Sustaining Region That Includes Doped Columns Formed By Trench Etching And Ion Implantation," filed in the United States Patent and Trademark Office on Dec. 31, 2001.

This application is related to copending U.S. patent application Ser. No. 10/039,241 entitled "High Voltage MOSFET Having A Voltage Sustaining Region That Includes Doped Columns Formed By Trench Etching And Diffusion From Regions of Oppositely Doped Polysilicon" filed in the United States Patent and Trademark Office on Dec. 31, 2001.

FIELD OF THE INVENTION

The present invention relates generally to semiconductor devices, and more particularly to power MOSFET devices.

BACKGROUND OF THE INVENTION

Power MOSFET devices are employed in applications such as automobile electrical systems, power supplies, and power management applications. Such devices should sustain high voltage in the off-state while having a low voltage drop and high current flow in the on-state.

FIG. 1 illustrates a typical structure for an N-channel power MOSFET. An N-epitaxial silicon layer 1 formed over an N+ silicon substrate 2 contains p-body regions 5a and 6a, and N+ source regions 7 and 8 for two MOSFET cells in the device. P-body regions 5 and 6 may also include deep p-body regions 5b and 6b. A source-body electrode 12 extends across certain surface portions of epitaxial layer 1 to contact the source and body regions. The N-type drain for both cells is formed by the portion of N-epitaxial layer 1 extending to the upper semiconductor surface in FIG. 1. A drain electrode is provided at the bottom of N+ substrate 2. An insulated gate electrode 18 typically of polysilicon lies primarily over the body and portions of the drain of the device, separated from the body and drain by a thin layer of dielectric, often silicon dioxide. A channel is formed between the source and drain at the surface of the body region when the appropriate positive voltage is applied to the gate with respect to the source and body electrode.

The on-resistance of the conventional MOSFET shown in FIG. 1 is determined largely by the drift zone resistance in epitaxial layer 1. The drift zone resistance is in turn determined by the doping and the layer thickness of epitaxial layer 1. However, to increase the breakdown voltage of the device, the doping concentration of epitaxial layer 1 must be reduced while the layer thickness is increased. Curve 20 in FIG. 2 shows the on-resistance per unit area as a function of the breakdown voltage for a conventional MOSFET. Unfortunately, as curve 20 shows, the on-resistance of the device increases rapidly as its breakdown voltage increases. This rapid increase in resistance presents a problem when the MOSFET is to be operated at higher voltages, particularly at voltages greater than a few hundred volts.

FIG. 3 shows a MOSFET that is designed to operate at higher voltages with a reduced on-resistance. This MOSFET is disclosed in paper No. 26.2 in the Proceedings of the IEDM, 1998, p. 683. This MOSFET is similar to the conventional MOSFET shown in FIG. 2 except that it includes p-type doped regions 40 and 42 which extend from beneath the body regions 5 and 6 into the drift region of the device. The p-type doped regions 40 and 42 define columns in the drift region that are separated by n-type doped columns, which are defined by the portions of the epitaxial layer 1 adjacent the p-doped regions 40 and 42. The alternating columns of opposite doping type cause the reverse voltage to be built up not only in the vertical direction, as in a conventional MOSFET, but in the horizontal direction as well. As a result, this device can achieve the same reverse voltage as in the conventional device with a reduced layer thickness of epitaxial layer 1 and with increased doping concentration in the drift zone. Curve 25 in FIG. 2 shows the on-resistance per unit area as a function of the breakdown voltage of the MOSFET shown in FIG. 3. Clearly, at higher operating voltages, the on-resistance of this device is substantially reduced relative to the device shown in FIG. 1, essentially increasing linearly with the breakdown voltage.

The improved operating characteristics of the device shown in FIG. 3 are based on charge compensation in the drift region of the transistor. That is, the doping in the drift region is substantially increased, e.g., by an order of magnitude or more, and the additional charge is counterbalanced by the addition of columns of opposite doping type. The blocking voltage of the transistor thus remains unaltered. The charge compensating columns do not contribute to the current conduction when the device is in its on state. These desirable properties of the transistor depend critically on the degree of charge compensation that is achieved between adjacent columns of opposite doping type. Unfortunately, nonuniformities in the dopant gradient of the columns can be difficult to avoid as a result of limitations in the control of process parameters during their fabrication. For example, diffusion across the interface between the columns and the substrate and the interface between the columns and the p-body region will give rise to changes in the dopant concentration of the portions of the columns near those interfaces.

The structure shown in FIG. 3 can be fabricated with a process sequence that includes multiple epitaxial deposition steps, each followed by the introduction of the appropriate dopant. Unfortunately, epitaxial deposition steps are expensive to perform and thus this structure is expensive to manufacture. Another technique for fabricating these devices is shown in copending U.S. application Ser. No. 09/970,972, in which a trench is successively etched to different depths. A dopant material is implanted and diffused through the bottom of the trench after each etching step to form a series of doped regions (so-called "floating islands") that collectively function like the p-type doped regions 40 and 42 seen in FIG. 3. However, the on-resistance of a device that uses the floating island technique is not as low as an identical device that uses continuous columns.

Accordingly, it would be desirable to provide a method of fabricating the MOSFET structure shown in FIG. 3 that requires a minimum number of epitaxial deposition steps so that it can be produced less expensively while also allowing sufficient control of process parameters so that a high degree of charge compensation can be achieved in adjacent columns of opposite doping type in the drift region of the device.

SUMMARY OF THE INVENTION

In accordance with the present invention, a method is provided for forming a power semiconductor device. The method begins by providing a substrate of a first conductivity type and then forming a voltage sustaining region on the substrate. The voltage sustaining region is formed by depositing an epitaxial layer of a first conductivity type on the substrate and forming at least one trench in the epitaxial layer. At least one doped column having a dopant of a second conductivity type is located in the epitaxial layer, adjacent a sidewall of the trench. The trench is etched using an etchant gas that also serves as a dopant source for the formation of the doped column. For example, if a p-type dopant such as boron is desired, $BCl_3$ may be used as the etchant gas. Alternatively, if an n-type dopant such as phosphorus is required, $PH_3$ may be used as the etchant gas. The dopant present in the gas is incorporated into the silicon defining the surfaces of the trench. This dopant is subsequently diffused to form the doped column surrounding the trench. The trench is filled with an insulating material such as silicon dioxide, silicon nitride, polysilicon, or a combination of such materials. The step of filling the trench may be performed before or after the dopant is diffused to form the doped column. Finally, at least one region of the second conductivity type is formed over the voltage sustaining region to define a junction therebetween.

The power semiconductor device formed by the inventive method may be selected from the group consisting of a vertical DMOS, V-groove DMOS, and a trench DMOS MOSFET, an IGBT, a bipolar transistor, and a diode.

In accordance with another aspect of the invention, a power semiconductor device is provided. The device includes a substrate of a first conductivity type and a voltage sustaining region disposed on the substrate. The voltage sustaining region includes an epitaxial layer having a first conductivity type and at least one trench located in the epitaxial layer. At least one doped column having a dopant of a second conductivity type is located in the epitaxial layer, adjacent a sidewall of the trench. The column is formed from a dopant introduced into the trench surfaces by the gas used to etch the trench, which dopant is subsequently diffused into the epitaxial layer. A filler material is also provided, which substantially fills the trench. At least one region of the second conductivity is disposed over the voltage sustaining region to define a junction therebetween.

DETAILED DESCRIPTION

In accordance with the present invention, a method of forming the p-type columns in the voltage sustaining layer of a semiconductor power device may be generally described as follows. First, one or more trenches are etched in the epitaxial layer that is to form the voltage sustaining region of the device. Each trench is centered where a doped column is to be located. The doped column is formed by dopant present in the gas that is used to etch the trench. As a result of the energy of the gas performing the etch, the dopant species present in the etchant gas becomes incorporated into the portion of the epitaxial layer located at the surfaces defining the trench. The dopant species is diffused to its final depth in the epitaxial layer to form the doped column. The trench or trenches are filled with a material that does not adversely affect the characteristics of the device. Exemplary materials that may be used for the material filling the trenches include undoped polysilicon, a dielectric such as silicon dioxide or silicon nitride, or other materials and combinations of materials. This process sequence forms a continuous doped column similar to those depicted in FIG. 3.

Figure 1:
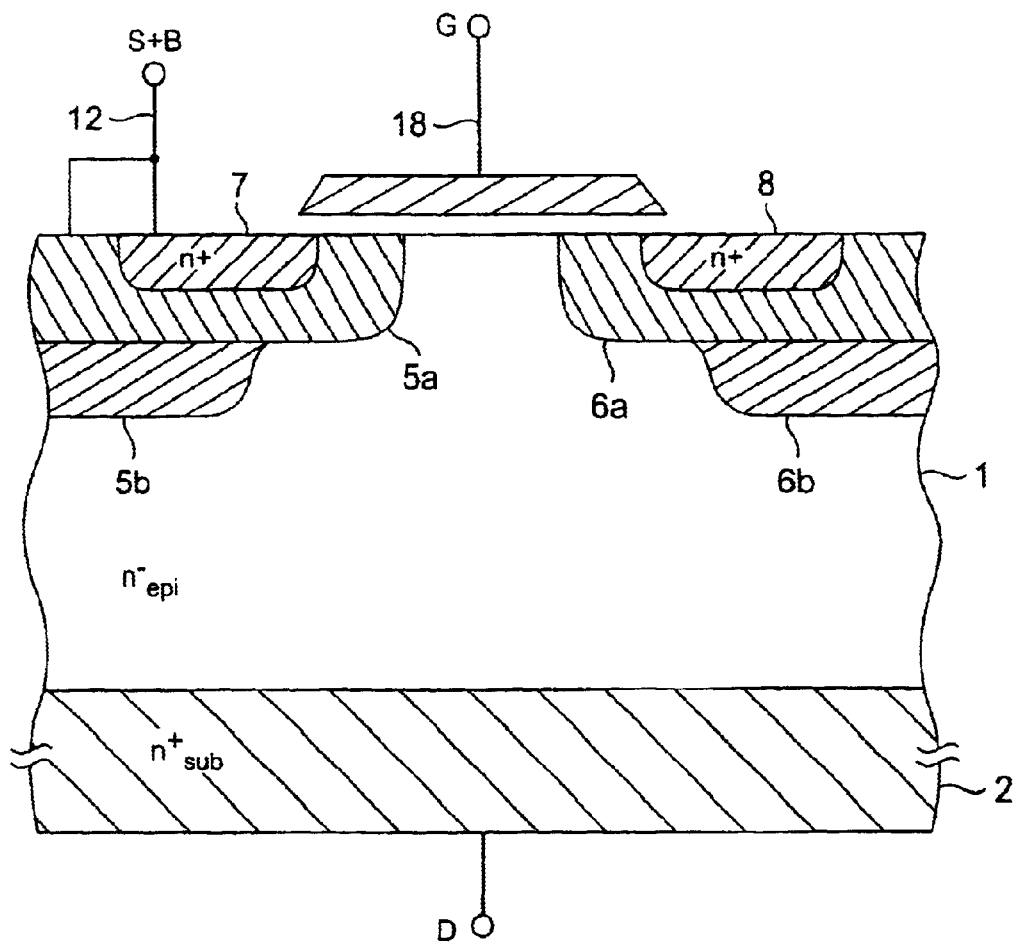
FIG. 1 shows a cross-sectional view of a conventional power MOSFET structure.
Figure 2:
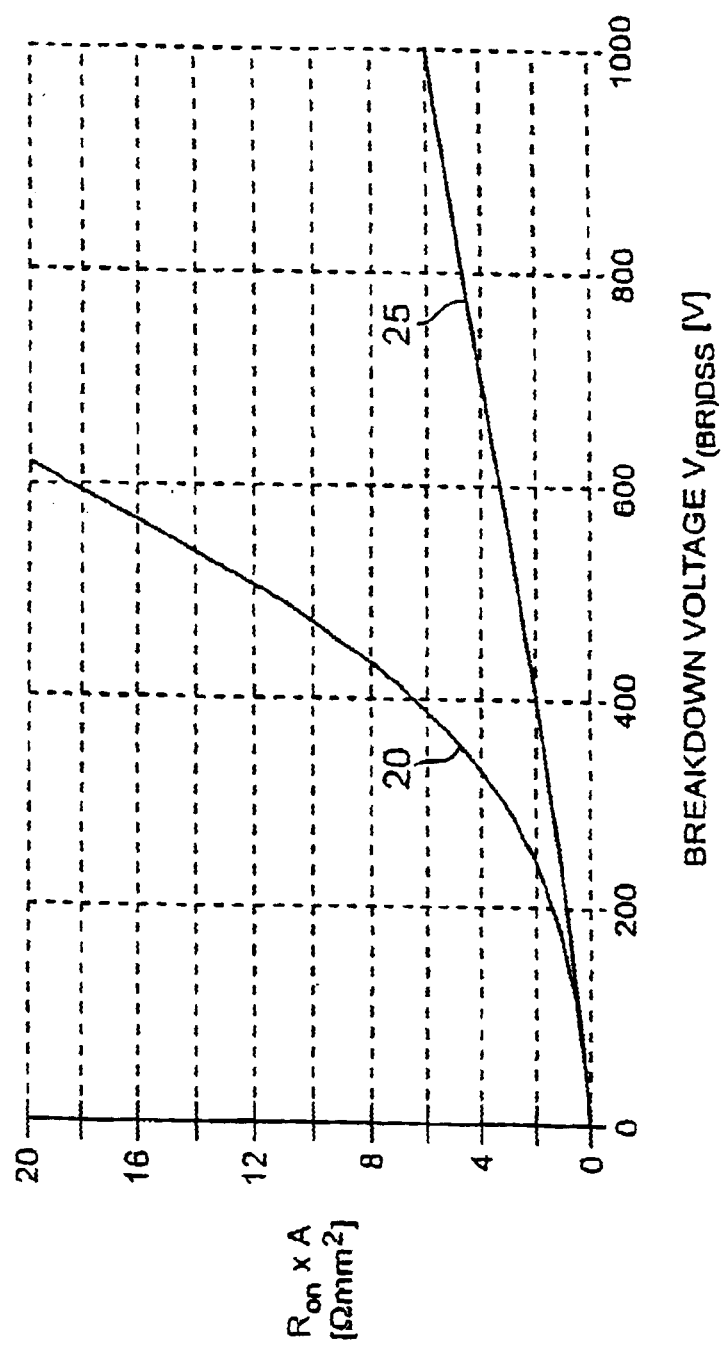
FIG. 2 shows the on-resistance per unit area as a function of the breakdown voltage for a conventional power MOSFET.
Figure 3:
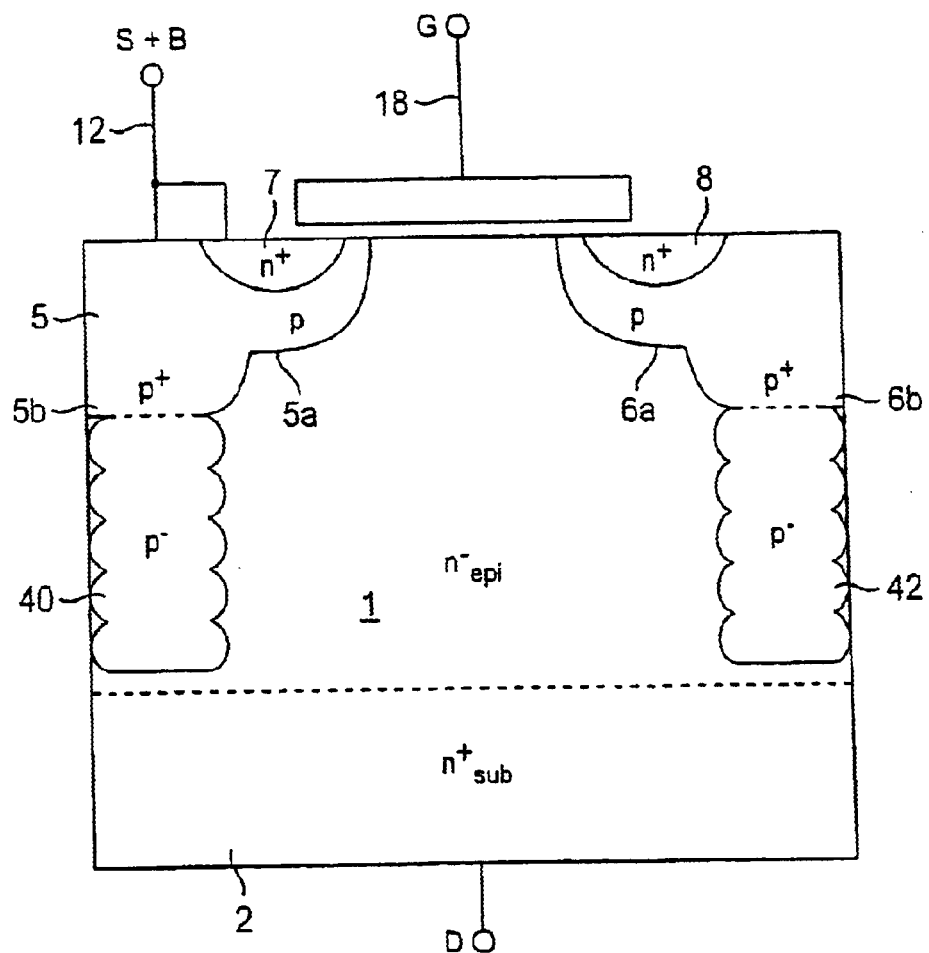
FIG. 3 shows a MOSFET structure that includes a voltage sustaining region with columns of p-type dopant located below the body region, which is designed to operate with a lower on-resistance per unit area at the same voltage than the structure depicted in FIG. 1.
Figure 4A:
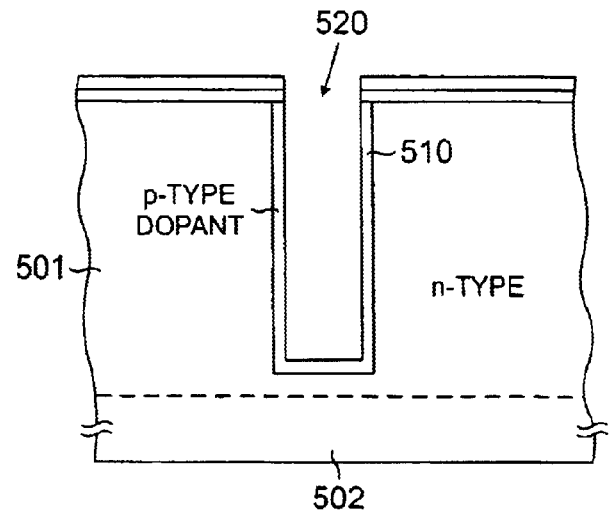
FIGS. 4(a)–4(b) show a sequence of exemplary process steps that may be employed to fabricate a voltage sustaining region constructed in accordance with the present invention.
Figure 4B:
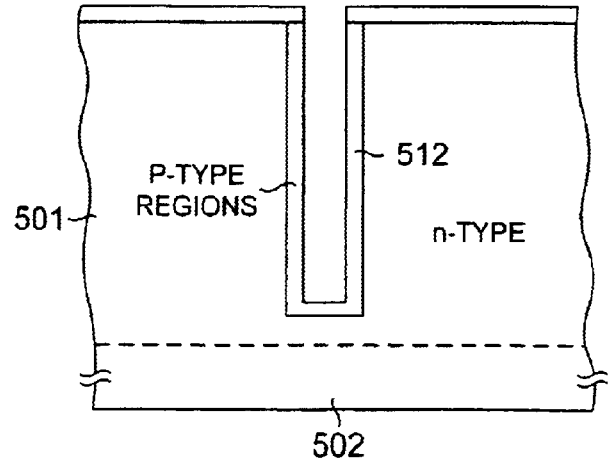

The power semiconductor device shown in FIG. 3 may be fabricated in accordance with the following exemplary steps, which are illustrated in FIGS. 4(a)–4(b).

First, the N-type doped epitaxial layer 501 is grown on a conventionally N+ doped substrate 502. Epitaxial layer 501 is typically 15–50 microns in thickness for a 400–800 V device with a resistivity of 5–40 ohm-cm. Next, a dielectric masking layer is formed by covering the surface of epitaxial layer 501 with a dielectric layer, which is then conventionally exposed and patterned to leave a mask portion that defines the location of the trench 520. The trench 520 is dry etched through the mask openings by reactive ion etching to an initial depth that may range, for example, from 10–45 microns. Alternatively, other dry etching techniques may be used such as plasma etching and ion beam milling. The trench is etched using an etchant gas that also serves as a dopant source for the formation of the doped column. For example, if, as in FIG. 4(a), a p-type dopant such as boron is desired, $BCl_3$ may be used as the etchant gas. Alternatively, if an n-type dopant such as phosphorus is desired, $PH_3$ may be used as the etchant gas. The dopant present in the gas is incorporated into a silicon layer 510 that defines the surfaces of the trench 520.

The sidewalls of each trench may be smoothed, if needed. First, a dry chemical etch may be used to remove a thin layer of oxide (typically about 500–1000 A) from the trench sidewalls to eliminate damage caused by the reactive ion etching process. Next, a sacrificial silicon dioxide layer is grown over the trench 520. The sacrificial layer is removed either by a buffer oxide etch or an HF etch so that the resulting trench sidewalls are as smooth as possible.

In FIG. 4(b), the trench is filled with an insulating material such as silicon ioxide, silicon nitride, undoped polysilicon, or a combination of such materials, which do not adversely affect the characteristics of the final device. The dopant species in silicon layer 510 is diffused to its final depth in the epitaxial layer 501 to form the doped column 512. The step of filling the trench may be performed before or after the dopant is diffused to form the doped column 512. In general, the trench depths, dopant dose and the magnitude and duration of the diffusion process should be selected to achieve the desired charge compensation. Finally, the surface of the structure is planarized in preparation for the formation of the remaining regions of the power semiconductor device.

The aforementioned sequence of processing steps resulting in the structure depicted in FIG. 4(b) provides a voltage sustaining layer with p-type doped columns on which any of a number of different power semiconductor devices can be fabricated. As previously mentioned, such power semiconductor devices include vertical DMOS, V-groove DMOS, and trench DMOS MOSFETs, IGBTs and other MOS-gated devices. For instance, FIG. 3 shows an example of a MOSFET that includes a voltage sustaining layer with doped columns constructed in accordance with the principles of the present invention. It should be noted that while FIG. 4 shows a single trench that is used to form the doped column, the present invention encompasses a voltage sustaining regions having single or multiple trenches to form any number of doped columns. For example, a doped column or columns may be located below the center of the gate or in other locations when appropriate to decrease the on-resistance of the device.

Once the voltage sustaining region and the doped column or columns have been formed as shown in FIG. 4, the MOSFET shown in FIG. 3 can be completed in the following manner. The gate oxide is grown after an active region mask is formed. Next, a layer of polycrystalline silicon is deposited, doped, and oxidized. The polysilcon layer is then masked to form the gate regions. The p+ doped deep body regions 5b and 6b are formed using conventional masking, implantation and diffusion steps. For example, the p+-doped deep body regions are boron implanted at 20 to 200 KeV with a dosage from about $1\times10^{14}$ to $5\times10^{15}/cm^2$. The shallow body regions 5a and 6a are formed in a similar fashion. The implant dose for this region will be $1\times10^{13}$ to $5\times10^{14}/cm^2$ at an energy of 20 to 100 KeV.

Figure 5:
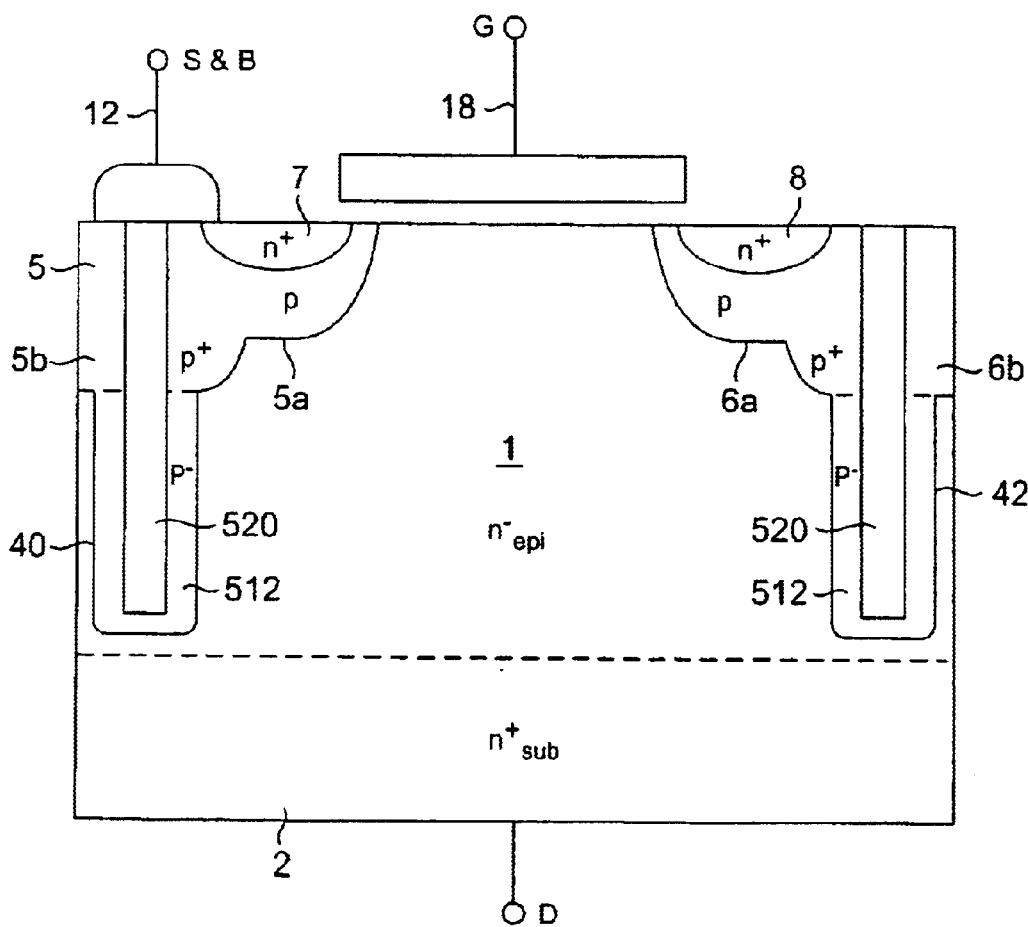
FIG. 5 shows a cross-section of a MOSFET constructed in accordance with the present invention.

Next, a photoresist masking process is used to form a patterned masking layer that defines source regions 7 and 8. Source regions 7 and 8 are then formed by an implantation and diffusion process. For example, the source regions may be implanted with arsenic at 20 to 100 KeV to a concentration that is typically in the range of $2\times10^{15}$ to $1.2\times10^{16}/cm^2$. After implantation, the arsenic is diffused to a depth of approximately 0.5 to 2.0 microns. The depth of the body region typically ranges from about 1–3 microns, with the P+ doped deep body region (if present) being slightly deeper. The DMOS transistor is completed in a conventional manner by etching the oxide layer to form contact openings on the front surface. A metallization layer is also deposited and masked to define the source-body and gate electrodes. Also, a pad mask is used to define pad contacts. Finally, a drain contact layer is formed on the bottom surface of the substrate, producing the device shown in FIG. 5.

It should be noted that while a specific process sequence for fabricating the power MOSFET is disclosed, other process sequences may be used while remaining within the scope of this invention. For instance, the deep p+ doped body region may be formed before the gate region is defined. It is also possible to form the deep p+ doped body region prior to forming the trenches. In some DMOS structures, the P+ doped deep body region may be shallower than the P-doped body region, or in some cases, there may not even be a P+ doped body region.

Although various embodiments are specifically illustrated and described herein, it will be appreciated that modifications and variations of the present invention are covered by the above teachings and are within the purview of the appended claims without departing from the spirit and intended scope of the invention. For example, a power semiconductor device in accordance with the present invention may be provided in which the conductivities of the various semiconductor regions are reversed from those described herein. Moreover, while a vertical DMOS transistor has been used to illustrate exemplary steps required to fabricate a device in accordance with the present invention, other DMOS FETs and other power semiconductor devices such as diodes, bipolar transistors, power JFETs, IGBTs, MCTs, and other MOS-gated power devices may also be fabricated following these teachings.

What is claimed is:

1. A method of forming a power semiconductor device comprising the steps of:

A. providing a substrate of a first or second conductivity type;

B. forming a voltage sustaining region on said substrate by:

a. depositing an epitaxial layer on the substrate, said epitaxial layer having a first conductivity type;

b. etching at least one trench in the epitaxial layer with an etchant gas having a dopant species of the second conductivity type to form a doped surface layer in a portion of the epitaxial layer defining the trench walls;

c. diffusing further into the epitaxial layer the dopant species located in said doped surface layer to form a doped epitaxial region adjacent to the trench and in the epitaxial layer;

d. depositing a filler material in said trench to substantially fill said trench; and C. forming over said voltage sustaining region at least one region of said second conductivity type to define a junction therebetween.

2. The method of claim 1 wherein the step of depositing the filler material is performed before the step of diffusing the dopant species.

3. The method of claim 1 wherein the step of depositing the filler material is performed after the step of diffusing the dopant species.

4. The method of claim 1 wherein step (C) further includes the steps of:

forming a gate conductor above a gate dielectric region;

forming first and second body regions in the epitaxial layer to define a drift region therebetween, said body regions having a second conductivity type;

forming first and second source regions of the first conductivity type in the first and second body regions, respectively.

5. The method of claim 1 wherein said material filling the trench is undoped polysilicon.

6. The method of claim 1 wherein said material filling the trench is a dielectric material.

7. The method of claim 6 wherein said dielectric material is silicon dioxide.

8. The method of claim 6 wherein said dielectric material is silicon nitride.

9. The method of claim 1 wherein said dopant species is boron.

10. The method of claim 9 wherein said etchant gas is $BCl_3$.

11. The method of claim 1 wherein said dopant species is phosphorus.

12. The method of claim 11 wherein said etchant gas is $PH_3$.

13. The method of claim 4 wherein said body regions include deep body regions.

14. The method of claim 1, wherein said trench is formed by providing a masking layer defining at least one trench, and etching the trench defined by the masking layer.

15. The method of claim 1 wherein the etching step is performed by reactive ion etching.

16. The method of claim 4, wherein said body region is formed by implanting and diffusing a dopant into the substrate.

17. The method of claim 1 wherein said power semiconductor device is selected from the group consisting of a vertical DMOS, V-groove DMOS, and a trench DMOS MOSFET, an IGBT, and a bipolar transistor.

* * * * *

UNITED STATES PATENT AND TRADEMARK OFFICE
CERTIFICATE OF CORRECTION

PATENT NO. : 6,750,104 B2  
APPLICATION NO. : 10/039284  
DATED : June 15, 2004  
INVENTOR(S) : Richard A. Blanchard Page 1 of 1

It is certified that error appears in the above-identified patent and that said Letters Patent is hereby corrected as shown below:

Col. 1, Line 55, after "18", insert -- , --.
Col. 1, Line 55, after "polysilicon", insert -- , --.
Col. 2, Line 13, after "FIG.", change "2" to -- 1 --.
Col. 2, Line 39, after "its", change "on state" to -- on-state --.
Col. 2, Line 47, after "substrate", insert -- , --.
Col. 2, Line 48, after "region", insert -- , --.
Col. 5, Line 18, before "having", change "regions" to -- region --.

Signed and Sealed this

Twenty-seventh Day of November, 2007

JON W. DUDAS  
*Director of the United States Patent and Trademark Office*